United States Patent
Rozenblit et al.

(10) Patent No.: US 9,614,477 B1
(45) Date of Patent: Apr. 4, 2017

(54) ENVELOPE TRACKING SUPPLY MODULATORS FOR MULTIPLE POWER AMPLIFIERS

(71) Applicant: Avago Technologies General IP (Singapore) Pte. Ltd., Singapore (SG)

(72) Inventors: Dmitriy Rozenblit, Irvine, CA (US); Tirdad Sowlati, Irvine, CA (US); Ali Afsahi, San Diego, CA (US); Debopriyo Chowdhury, San Diego, CA (US); Sraavan R. Mundlapudi, San Diego, CA (US); Morteza Vadipour, Woodland Hills, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 15/011,186

(22) Filed: Jan. 29, 2016

Related U.S. Application Data (60) Provisional application No. 62/277,702, filed on Jan. 12, 2016.

(51) Int. Cl.

| | |
|---|---|
| *H03F 3/04* | (2006.01) |
| *H03G 3/20* | (2006.01) |
| *H03F 1/02* | (2006.01) |
| *H03F 3/193* | (2006.01) |
| *H03F 3/21* | (2006.01) |

(52) U.S. Cl.
CPC ........... *H03F 1/0227* (2013.01); *H03F 3/193* (2013.01); *H03F 3/211* (2013.01); *H03F 2200/102* (2013.01); *H03F 2200/451* (2013.01); *H03F 2203/21142* (2013.01)

(58) Field of Classification Search
CPC .................................. H03F 3/04; H03G 3/20
USPC ......................................... 330/297, 127, 10
See application file for complete search history.

(56) References Cited

U.S. PATENT DOCUMENTS

| | | | | |
|---|---|---|---|---|
| 6,900,697 | B1* | 5/2005 | Doyle | H03F 1/0222 330/296 |
| 2005/0110565 | A1* | 5/2005 | Robinson | H03C 5/00 330/124 R |
| 2012/0146731 | A1* | 6/2012 | Khesbak | H03F 1/0222 330/295 |
| 2012/0326783 | A1* | 12/2012 | Mathe | H03F 1/0227 330/251 |

(Continued)

*Primary Examiner* — Patricia T Nguyen
(74) *Attorney, Agent, or Firm* — Sterne, Kessler, Goldstein & Fox P.L.L.C.

(57) ABSTRACT

The present disclosure is directed to an envelope tracking supply modulator for multiple PAs. The envelope tracking supply modulator is configured to provide, for each of the multiple PAs, a separate supply voltage that is modulated based on the envelope of the respective RF input signal to the PA. Each of the modulated supply voltages is constructed from a DC component and an alternating current (AC) component. The DC component for each modulated supply voltage is generated by a main switching regulator that is shared by the multiple PAs. In one embodiment, the AC component for each modulated supply voltage is generated by an auxiliary switching regulator that is shared by the multiple PAs and a separate linear regulator for each of the multiple PAs. In another embodiment, the AC component for each modulated supply voltage is generated by a separate buffer.

20 Claims, 7 Drawing Sheets

(56) References Cited

U.S. PATENT DOCUMENTS

| | | | | |
|---|---|---|---|---|
| 2013/0135043 A1* | 5/2013 | Hietala | ................ | H03F 1/0277 330/124 R |
| 2013/0207731 A1* | 8/2013 | Balteanu | ................... | H03F 1/02 330/296 |
| 2014/0361837 A1* | 12/2014 | Strange | ................ | H03F 1/0222 330/297 |

* cited by examiner

ENVELOPE TRACKING SUPPLY MODULATORS FOR MULTIPLE POWER AMPLIFIERS

CROSS REFERENCE TO RELATED APPLICATIONS

This application claims the benefit of U.S. Provisional Application No. 62/277,702, filed Jan. 12, 2016, which is incorporated herein by reference in its entirety.

TECHNICAL FIELD

This application relates generally to envelope tracking supply modulators for power amplifiers.

BACKGROUND

A radio frequency (RF) power amplifier (PA) is used to amplify an RF signal by converting direct current (DC) power to RF power. RF PAs are commonly found in wireless communication devices for driving the antenna(s) of a transmitter. The power consumption of an RF PA is often an important figure of merit because these wireless communication devices, such as mobile user equipment (UE) in cellular networks, are often battery operated. However, even in non-battery operated wireless communication devices, such as cellular base stations (BSs), the power consumption of an RF PA may still be an important consideration given that a large majority of operating expenditures associated with these devices is often energy.

Two metrics commonly used to measure the efficiency of a power amplifier include drain/collector efficiency $\eta$ and power added efficiency (PAE). Drain/collector efficiency $\eta$ provides a measure of how much of the DC input power to a PA is converted to RF output power and is given by the ratio of the RF output power of the PA to the DC input power of the PA. PAE primarily differs from drain/collector efficiency $\eta$ in that it takes into further consideration the power of the input RF signal to the PA. PAE is given by:

$$PAE = \frac{P_{out} - P_{in}}{P_{DC}} \times 100\%$$

where $P_{out}$ is the RF output power of the PA, $P_{DC}$ is the DC input power of the PA, and $P_{in}$ is the power of the RF input signal to the PA.

Traditionally, linear PAs are biased so that there is sufficient DC input power to supply for peak RF output power conditions. Peak RF output power conditions generally occur when the RF input signal to the PA is at a maximum. However, when the PA is "backed-off" from the peak RF output power conditions, the excess DC input power must be dissipated by the PA because it is not being transformed into useful RF output power. Thus, PAs are generally most efficient during peak RF output power conditions.

Figure 1A:
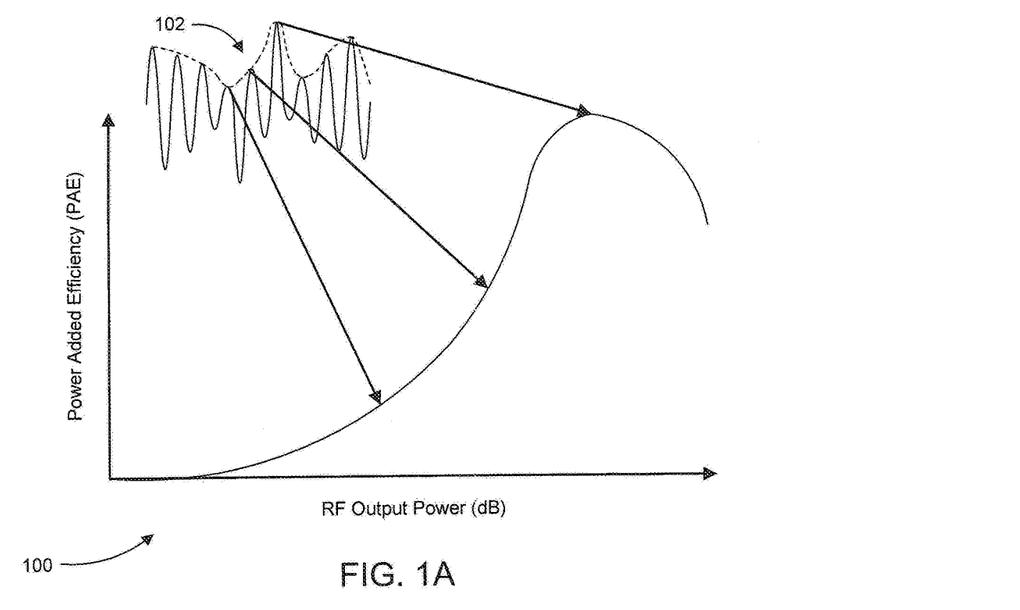
FIG. 1A illustrates a plot of PAE versus RF output power for an exemplary PA.

FIG. 1A illustrates a plot 100 of PAE versus RF output power for an exemplary PA biased so that there is sufficient DC input power to supply for peak RF output power conditions. FIG. 1A further illustrates an exemplary RF input signal 102 to the exemplary PA. As can be seen from FIG. 1A, the PA operates at its highest PAE level at the point where the RF input signal 102 is at a maximum. This is because most of the DC input power to the PA is being transformed into useful RF output power when the RF input signal 102 is at a maximum. As can be further seen from FIG. 1A, the PAE of the PA decreases with decreasing values of the RF input signal 102. This is because at smaller values of the RF input signal 102, less of the DC input power is being transformed into useful RF output power and more is being dissipated by the PA.

Figure 1B:
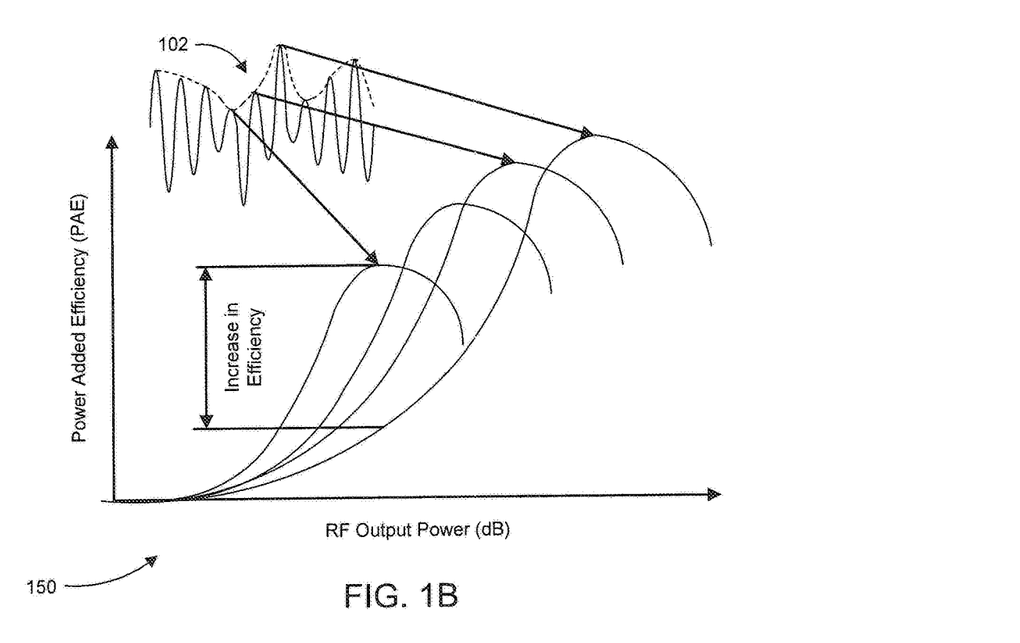
FIG. 1B illustrates a plot of PAE versus RF output power for an exemplary envelope tracking PA.

To improve the PAE of a linear PA, envelope tracking PAs are often used. The basic idea of an envelope tracking PA is to track the envelope of the RF input signal and use the envelope to modulate the DC input power (or voltage supply) of the PA. As the magnitude of the envelope of the RF input signal decreases, the DC input power of the PA is correspondingly reduced such that the PAE curve of the PA is shifted to the left and the PA remains in a high PAE region. FIG. 1B illustrates a plot 150 of PAE versus RF output power for an exemplary envelope tracking PA. From FIG. 1B, as the envelope of the RF input signal 102 decreases, the DC input power of the PA is correspondingly decreased such that the PA remains in a high PAE region, albeit on a different PAE curve due to the change in DC input power. FIG. 1B further illustrates the increase in efficiency over a non-envelope tracking PA when the RF input signal 102 is at a minimum.

In many devices, multiple envelope tracking PAs are used. For example, in mobile UEs with multiple antennas, each antenna may be driven by a separate envelope tracking PA. Each of the multiple envelope tracking PAs are traditionally implemented independently of each other without any sharing of components between them, which can lead to higher component counts, larger die and/or board area, and increased monetary costs.

BRIEF DESCRIPTION OF THE DRAWINGS/FIGURES

The accompanying drawings, which are incorporated herein and form a part of the specification, illustrate the present disclosure and, together with the description, further serve to explain the principles of the disclosure and to enable a person skilled in the pertinent art to make and use the disclosure.

The present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the disclosure. However, it will be apparent to those skilled in the art that the disclosure, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It will be apparent to persons skilled in the relevant art(s) that various elements and features of the present disclosure, as described herein, can be implemented in hardware using analog and/or digital circuits, in software, through the execution of instructions by one or more general purpose or special-purpose processors, or as a combination of hardware and software.

1. OVERVIEW

The present disclosure is directed to an envelope tracking supply modulator for multiple PAs. The envelope tracking supply modulator is configured to provide, for each of the multiple PAs, a separate supply voltage that is modulated based on the envelope of the respective RF input signal to the PA. Each of the modulated supply voltages is constructed from a DC component and an alternating current (AC) component. The DC component for each modulated supply voltage is generated by a main switching regulator that is shared by the multiple PAs.

In one embodiment, the AC component for each modulated supply voltage is generated by an auxiliary switching regulator that is shared by the multiple PAs and a separate linear regulator for each of the multiple PAs. Each of the linear regulators generates the AC component for the supply voltage of one of the multiple PAs by modulating an output voltage of the auxiliary switching regulator based on the envelope of the respective RF input signal to the PA.

In another embodiment, the AC component for each modulated supply voltage is generated by a separate buffer. Each of the separate buffers generates the AC component for the supply voltage of one of the multiple PAs by modulating an output voltage of the main switching regulator based on the envelope of the respective RF input signal to the PA.

These and other embodiments of the present disclosure are described further below.

2. ENVELOPE TRACKING POWER AMPLIFIER

Figure 2:
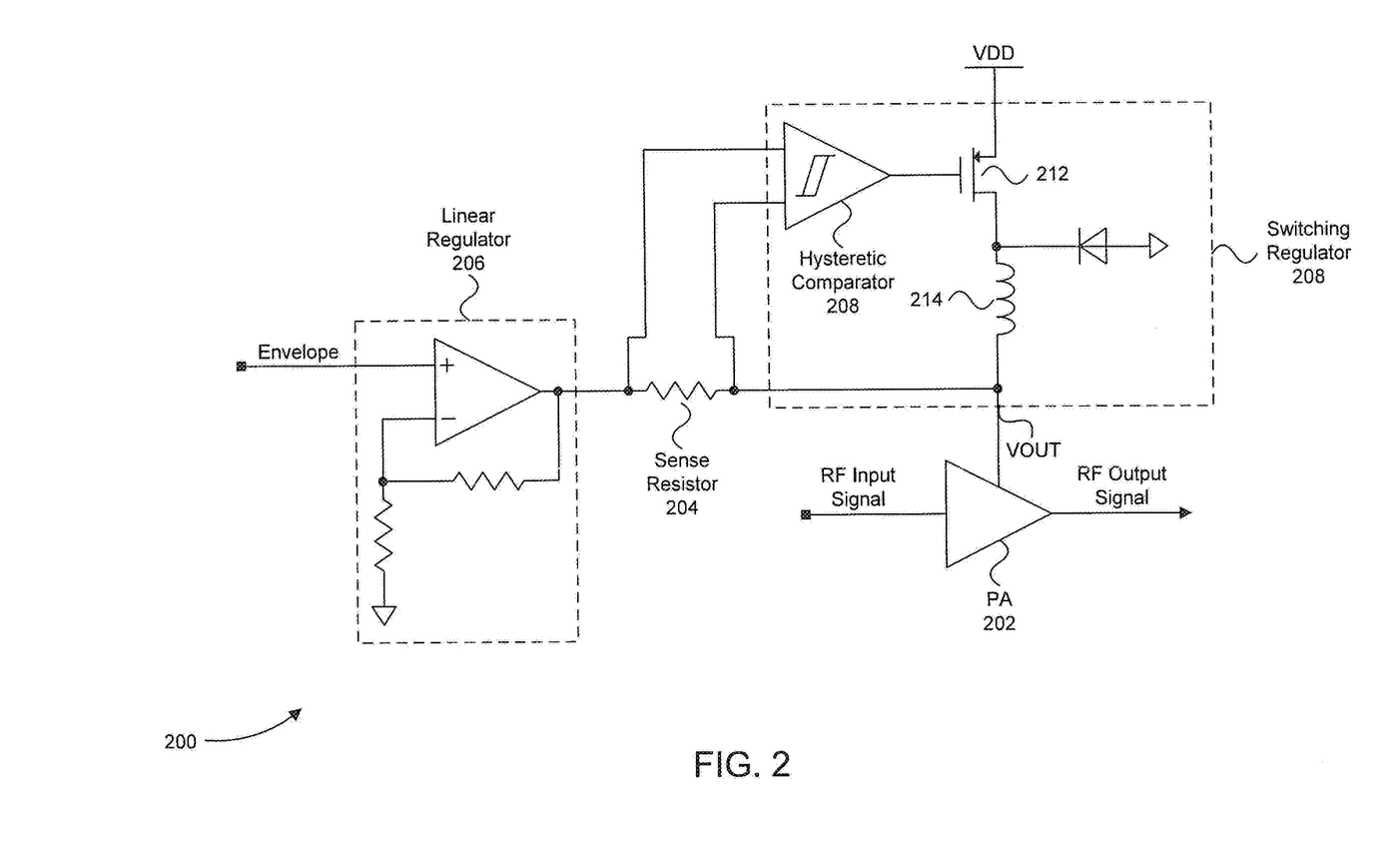
FIG. 2 illustrates a block diagram of an exemplary envelope tracking PA in accordance with embodiments of the present disclosure.

Referring now to FIG. 2, a block diagram of an exemplary envelope tracking PA 200 is illustrated. As shown in FIG. 2, envelope tracking PA 200 includes a PA 202 that receives an RF input signal and provides an amplified RF output signal, a sense resistor 204, and two voltage regulators: linear regulator 206 and switching regulator 208.

Envelope tracking PA 200 uses two voltage regulators (i.e., linear regulator 206 and switching regulator 208) in order to meet both of two different important design criteria for envelope tracking PAs: the ability to generate a modulated supply voltage VOUT for PA 202 that accurately tracks the envelope of the RF input signal to PA 202, and the ability to maintain a high-level of efficiency in generating the modulated supply voltage VOUT. Linear regulator 206 has relatively poor energy conversion efficiency (e.g., 40%-50%) but has a fast transient response that is able to accurately track high-frequency changes in the envelope of the RF input signal and reflect those changes in the modulated supply voltage VOUT. Switching regulator 208, on the other hand, can achieve high energy-conversion efficiency (e.g., 85% to 95%) but has a slow transient response that is not able to track high-frequency changes in the envelope of the RF input signal.

Thus, the combination of the two voltage regulators along with appropriate control can be used to generate a modulated supply voltage VOUT for PA 202 that accurately tracks high-frequency changes in the envelope of the RF input signal, while at the same time maintaining a high-level of efficiency in generating the modulated supply voltage VOUT from supply voltage VDD. Although not shown in FIG. 2 for clarity purposes, supply voltage VDD can be used to power linear regulator 206.

To provide further context, during operation of envelope tracking PA 200, the operational amplifier of linear regulator 206 will provide current to PA 202 based on the envelope of a received RF input signal. This causes the voltage across sense resistor 204 to increase and, eventually, hysteretic comparator 210 in switching regulator 208 to turn on. While on, hysteric comparator 210 turns on power switch 212, which results in an increase in the current in inductor 214 and a corresponding decrease in the current provided by the operational amplifier of linear regulator 206. The voltage across sense resistor 204 further decreases until hysteretic comparator 210 turns off. After hysteretic comparator 210 turns off, the power switch 212 begins to turn off so that the current in inductor 214 will decrease and the current provided by the operational amplifier of linear regulator 206 will increase.

This general sequence of events will repeat during operation of envelope tracking PA 200 and, assuming appropriate values are used for the components (e.g., the resistance of sense resistor 204, the hysteresis band for hysteretic comparator 208, and the inductance of inductor 214) shown in FIG. 2, switching regulator 208 will provide power for amplification of the DC and lower frequency components of the RF input signal envelope, which typically contain most of the energy consumed by a PA in many of today's wireless communication devices, while linear regulator 206 handles the remaining higher frequency components of the RF input signal envelope.

Figure 3:
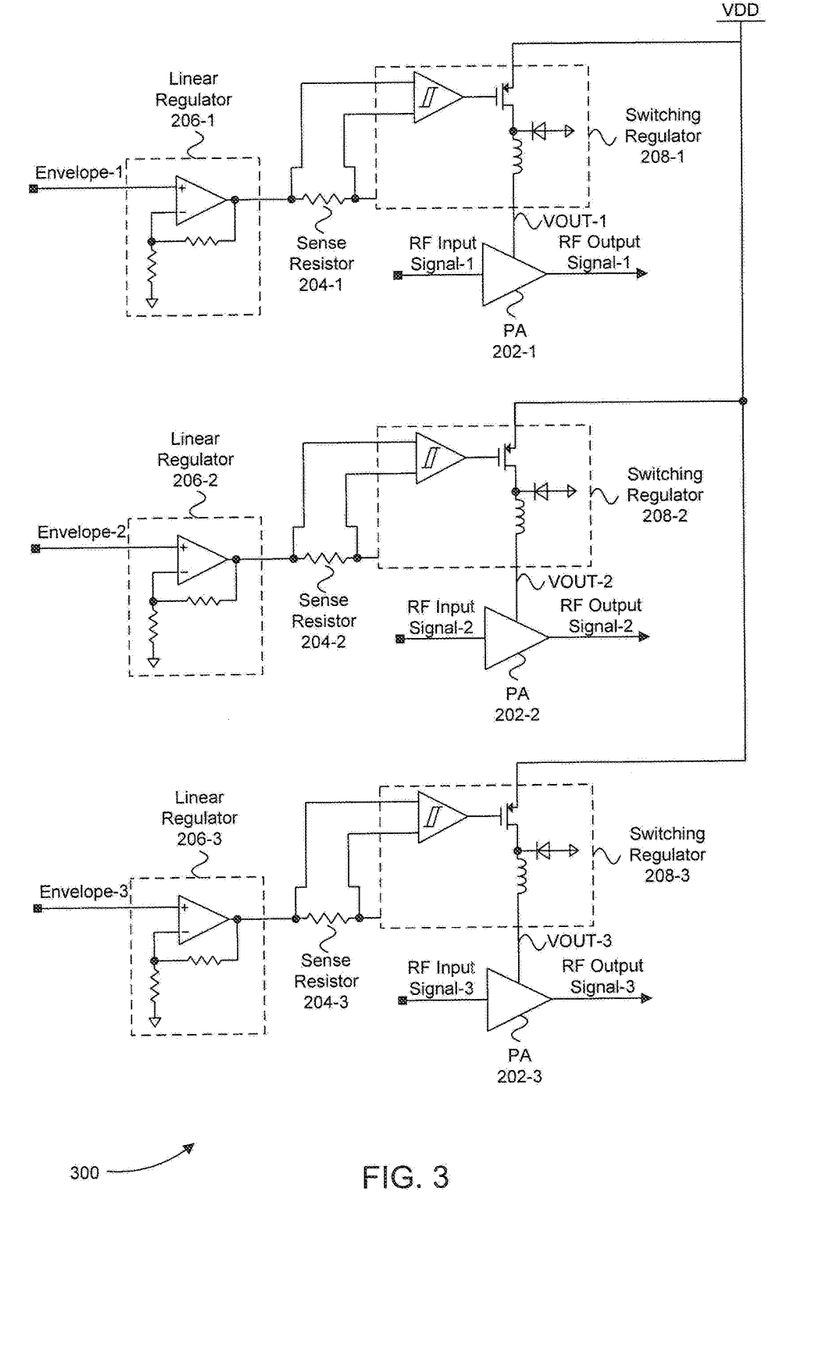
FIG. 3 illustrates a block diagram of exemplary implementation of multiple independent envelope tracking PAs in accordance with embodiments of the present disclosure.

Referring now to FIG. 3, an envelope tracking supply modulator 300 for multiple PAs is illustrated. Envelope tracking supply modulator 300 specifically supports three PAs using three separate instances of Envelope tracking PA 200 in FIG. 2. In many devices, multiple envelope tracking PAs are used. For example, in mobile UEs with multiple antennas, each antenna may be driven by a separate envelope tracking PA. The multiple antennas are generally used by such devices to perform a multi-antenna technique or multiple-input multiple-output (MIMO) technique, such as diversity, beamforming, or spatial multiplexing.

To provide a specific example of such a technique, it is known that a signal transmitted over a radio channel is corrupted due to time dispersion. Time dispersion occurs when the transmitted signal propagates to a receiver over the radio channel via multiple, independently fading paths with different delays. Such a time dispersive channel corresponds to a non-flat channel response in the frequency domain.

In the case where the transmitted signal uses a relatively wideband carrier, each symbol carried by the signal will be transmitted over frequencies of the time dispersive channel with both good quality (high signal strength) and bad quality (low signal strength). As a result, these symbols are said to experience frequency diversity. On the other hand, in the case where the transmitted signal uses a relatively narrowband carrier, such as those used in orthogonal frequency division multiplexing (OFDM) transmission, each symbol carried by the signal will experience comparatively less frequency diversity. As a result, the symbols can be confined to transmission over frequencies of the time dispersive channel with only bad quality (low signal strength), leading to a poor error-rate performance at the receiver.

The multi-antenna technique of diversity can be used to improve performance in such an instance. For example, in at least one application, diversity refers to the different fading experienced by signals transmitted from transmit antennas that are spatially separated. This diversity in fading can be exploited to create artificial frequency diversity by transmitting the same narrowband carrier from the multiple transmit antennas.

The multiple PAs in envelope tracking supply modulator 300 can be used to drive the multiple transmit antennas in a device that performs such a technique or one of the other multi-antenna techniques mentioned above. As can be seen from FIG. 3, each of the three separate instances of Envelope tracking PA 200 are implemented independently of each other without any sharing of components between them. This can lead to higher component counts, larger die and/or board area, and increased monetary costs, especially in devices that implement many more than three antennas or that require many more than three PAs.

3. ENVELOPE TRACKING SUPPLY MODULATOR FOR MULTIPLE PAS WITH COMPONENT SHARING

Figure 4:
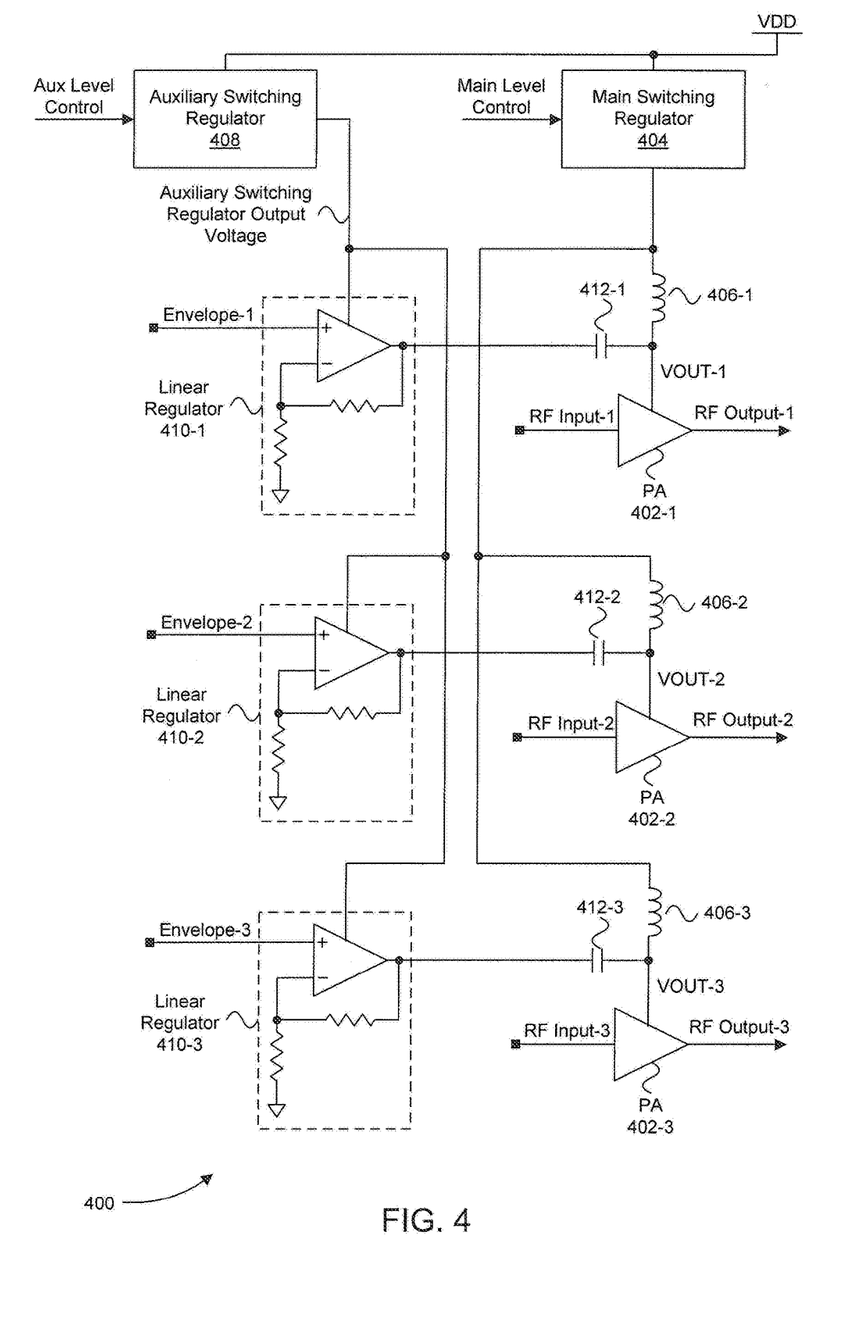
FIG. 4 illustrates a block diagram of an exemplary envelope tracking supply modulator for multiple PAs with component sharing in accordance with embodiments of the present disclosure.

Referring now to FIG. 4, an envelope tracking supply modulator 400 for multiple PAs is illustrated in accordance with embodiments of the present disclosure. Envelope tracking supply modulator 400 is configured to provide, for each of the multiple PAs it supports, a separate modulated supply voltage VOUT that is modulated based on the envelope of the respective RF input signal to the PA. More specifically, envelope tracking supply modulator 400 is configured to provide: modulated supply voltage VOUT-1 to PA 402-1 based on envelope-1 of RF input-1; modulated supply voltage VOUT-2 to PA 402-2 based on envelope-2 of RF input-2; and modulated supply voltage VOUT-3 to PA 402-3 based on envelope-3 of RF input-3. Each of the modulated supply voltages VOUT-1, VOUT-2, and VOUT-3 is constructed from a DC component and an AC component.

The DC component for each modulated supply voltage VOUT-1, VOUT-2, and VOUT-3 is generated by a main switching regulator 404 that is, for the most part, shared by PAs 402-1, 402-2, and 402-3. Non-shared parts of main switching regulator 404 include three separate inductors 406-1, 406-2, and 406-3 that are shown outside of main switching regulator 404 for ease of illustration. Inductors 406-1, 406-2, and 406-3 receive voltage pulses from a power switch in main switching regulator 404 and function to filter the voltage pulses into a smooth output voltage.

In one embodiment, main switching regulator 404 receives a main level control signal that controls the level of the DC voltage provided to each of PAs 402-1, 402-2, and 402-3. The main level control signal can be set based on the DC voltage components of the envelopes of the RF input signals to PAs 402-1, 402-2, and 402-3. In one embodiment, the main level control signal can be set based on the RF input signal to PA 402-1, PA 402-2, and PA 402-3 with the smallest DC voltage component. In many applications, however, the DC voltage components of the envelopes of the RF input signals to each of PAs 402-1, 402-2, and 402-3 will be equal or nearly equal in value.

Main switching regulator 404 is powered by supply voltage VDD and can be a buck converter type switching regulator (like switching regulator 208 in FIG. 2) or a boost or buck-boost converter type switching regulator. Unlike a buck converter, which only down-converters an input supply voltage to a lower output voltage, a boost or buck-boost converter can also up-convert an input supply voltage to a higher output voltage.

The AC component for each of the modulated supply voltages VOUT-1, VOUT-2, and VOUT-3 is generated by an auxiliary switching regulator 408, which is shared by PAs 402-1, 402-2, and 402-3, in conjunction with separate linear regulators 410-1, 410-2, and 410-2 for PAs 402-1, 402-2, and 402-3, respectively. More specifically, each of linear regulators 410-1, 410-2, and 410-2 provides the AC component for the supply voltage of one of the multiple PAs by modulating the auxiliary switching regulator output voltage based on the envelope of the respective RF input signal to the PA. For example, linear regulator 410-1 provides the AC component for VOUT-1 to PA 402-1 by modulating the auxiliary switching regulator output voltage based on envelope-1 of RF input-1. Linear regulators 410-1, 410-2, and 410-2 couple the AC components to PAs 402-1, 402-2, and 402-3 through AC coupling capacitors 412-1, 412-2, and 412-3.

In general, because the AC component for each of the supply voltages VOUT-1, VOUT-2, and VOUT-3 to PAs 402-1, 402-2, and 402-3 is only a portion of the entire supply voltage (with the remaining coming from the DC component provided by main switching regulator 404), the supply voltage used by linear regulators 410-1, 410-2, and 410-3 to provide the AC components does not have to be VDD. Rather, a lower supply voltage can be used by linear regulators 410-1, 410-2, and 410-3 to provide the AC components, which reduces the amount of power dissipated by linear regulators 410-1, 410-2, and 410-3. Auxiliary switching regulator 408 is used for this very purpose. Auxiliary switching regulator 408 reduces the supply voltage VDD to a lower supply voltage, referred to as the auxiliary switching regulator output voltage as shown in FIG. 4, in an efficient manner. In one embodiment, auxiliary switching regulator 408 receives an auxiliary level control signal that controls the level of the auxiliary switching regulator output voltage provided to each of linear regulators 410-1, 410-2, 410-3. Auxiliary switching regulator 408 can be any reasonable buck type switching regulator. In another embodiment, auxiliary switching regulator 408 can be a boost type switching regulator or buck-boost type switching regulator where the supply voltage VDD is lower than the desired voltage level of the auxiliary switching regulator output voltage at least during some portion of the time in which envelope tracking supply modulator 400 is operated.

It should be noted that the resistive feedback network shown in linear regulators 410-1, 410-2, 410-3 is provided by way of example and not limitation. Other feedback networks with more or less components, including components other than resistors, can be used as would be appreciated by one of ordinary skill in the art. It should be further noted that envelope tracking supply modulator 400 can be extended to support more or less than the three PAs shown in FIG. 4 as would be appreciated by one of ordinary skill in the art.

Figure 5:
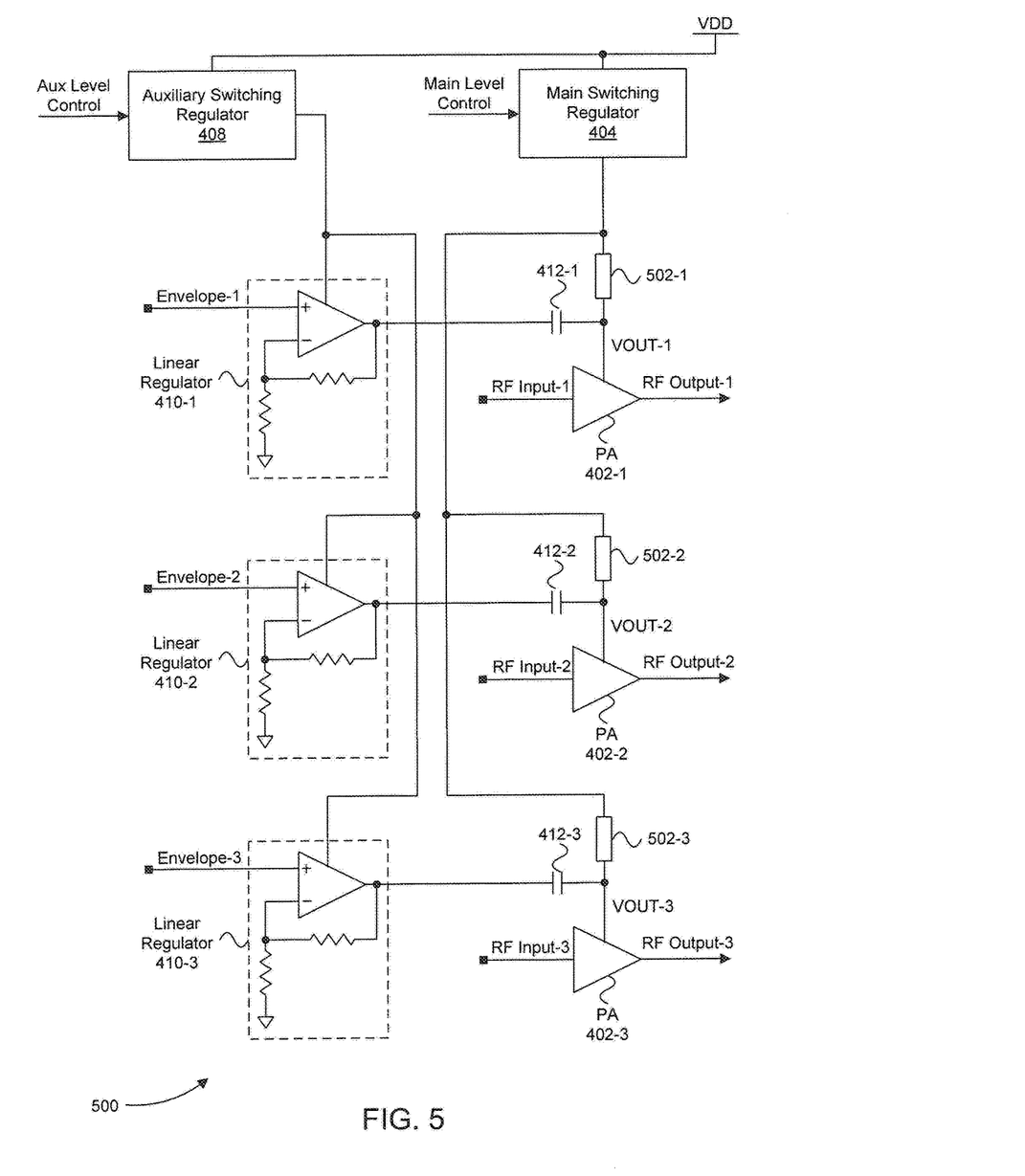
FIG. 5 illustrates a block diagram of an exemplary envelope tracking supply modulator for multiple PAs with component sharing in accordance with embodiments of the present disclosure.

Referring now to FIG. 5, an envelope tracking supply modulator 500 for multiple PAs is illustrated in accordance with embodiments of the present disclosure. Envelope tracking supply modulator 500 has the same configuration as envelope tracking supply modulator 400 in FIG. 4 with the exception that inductors 406-1, 406-2, and 406-3 are replaced by ferrite beads 502-1, 502-2, and 502-3 that provide isolation between the output of main switching regulator 404 and the respective supply voltage inputs to PAs 402-1, 402-2, and 402-3. Main switching regulator 404 in FIG. 5 can include a single inductor (not shown) to provide the functionality of the three separate inductors 406-1, 406-2, and 406-3 shown in FIG. 4.

Figure 6:
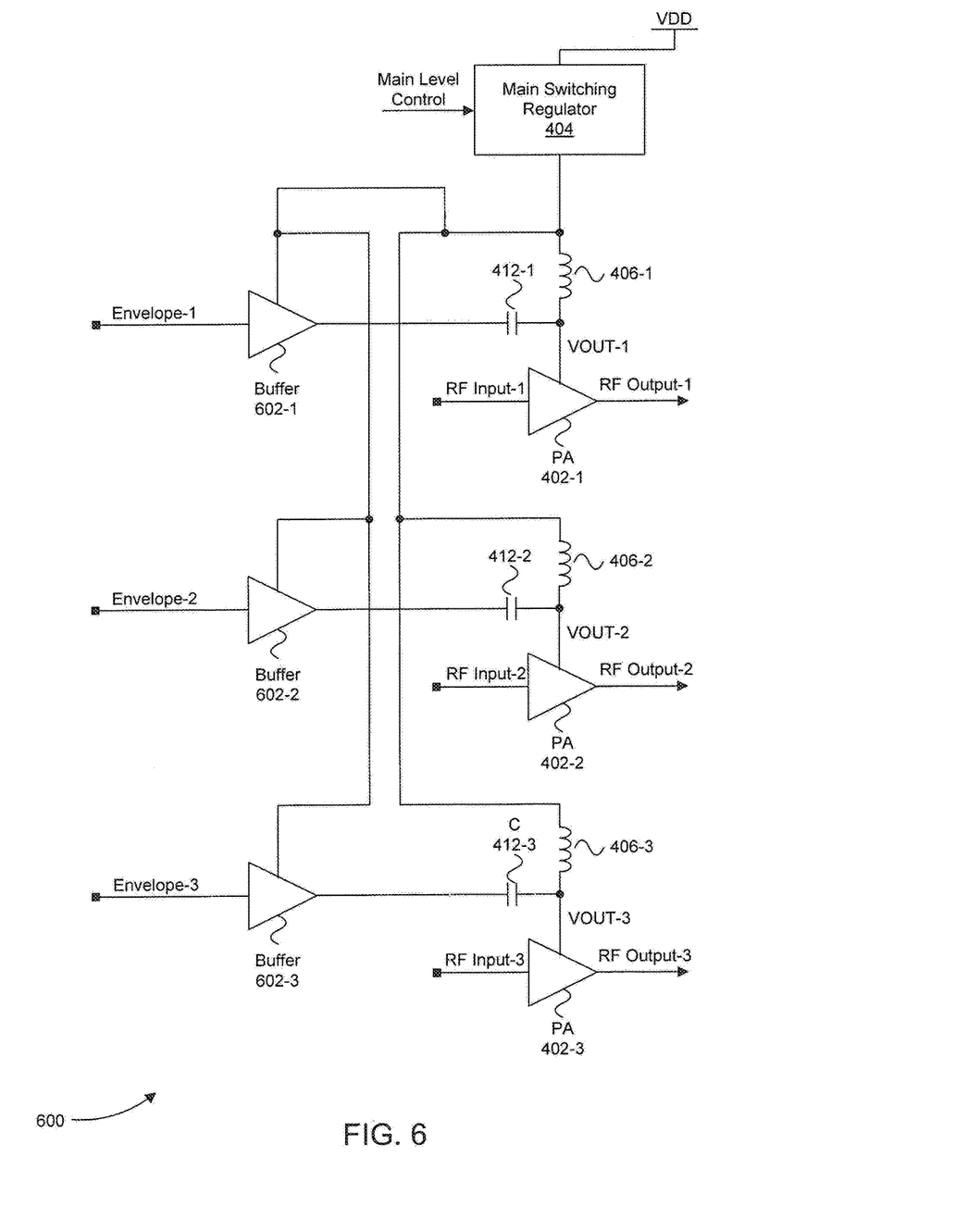
FIG. 6 illustrates a block diagram of an exemplary envelope tracking supply modulator for multiple PAs with component sharing in accordance with embodiments of the present disclosure.

Referring now to FIG. 6, an envelope tracking supply modulator 600 for multiple PAs is illustrated in accordance with embodiments of the present disclosure. Envelope tracking supply modulator 600 has the same configuration as envelope tracking supply modulator 400 in FIG. 4 with the exception that auxiliary switching regulator 408 and linear regulators 410-1, 410-2, and 410-3 have been replaced with buffers 602-1, 602-2, and 602-3. Buffers 602-1, 602-2, and 602-3 can be, for example, dynamic source followers, such as those commonly used as digital-to-analog converter (DAC) buffers. Buffer 602-1 is configured to provide the AC component for the supply voltage of PA 402-1 by modulating the output voltage of main switching regulator 404 based on envelope-1 of RF input-1. Buffer 602-2 is configured to provide the AC component for the supply voltage of PA 402-2 by modulating the output voltage of main switching regulator 404 based on envelope-2 of RF input-2. Buffer 602-3 is configured to provide the AC component for the supply voltage of PA 402-3 by modulating the output voltage of main switching regulator 404 based on envelope-3 of RF input-3.

Figure 7:
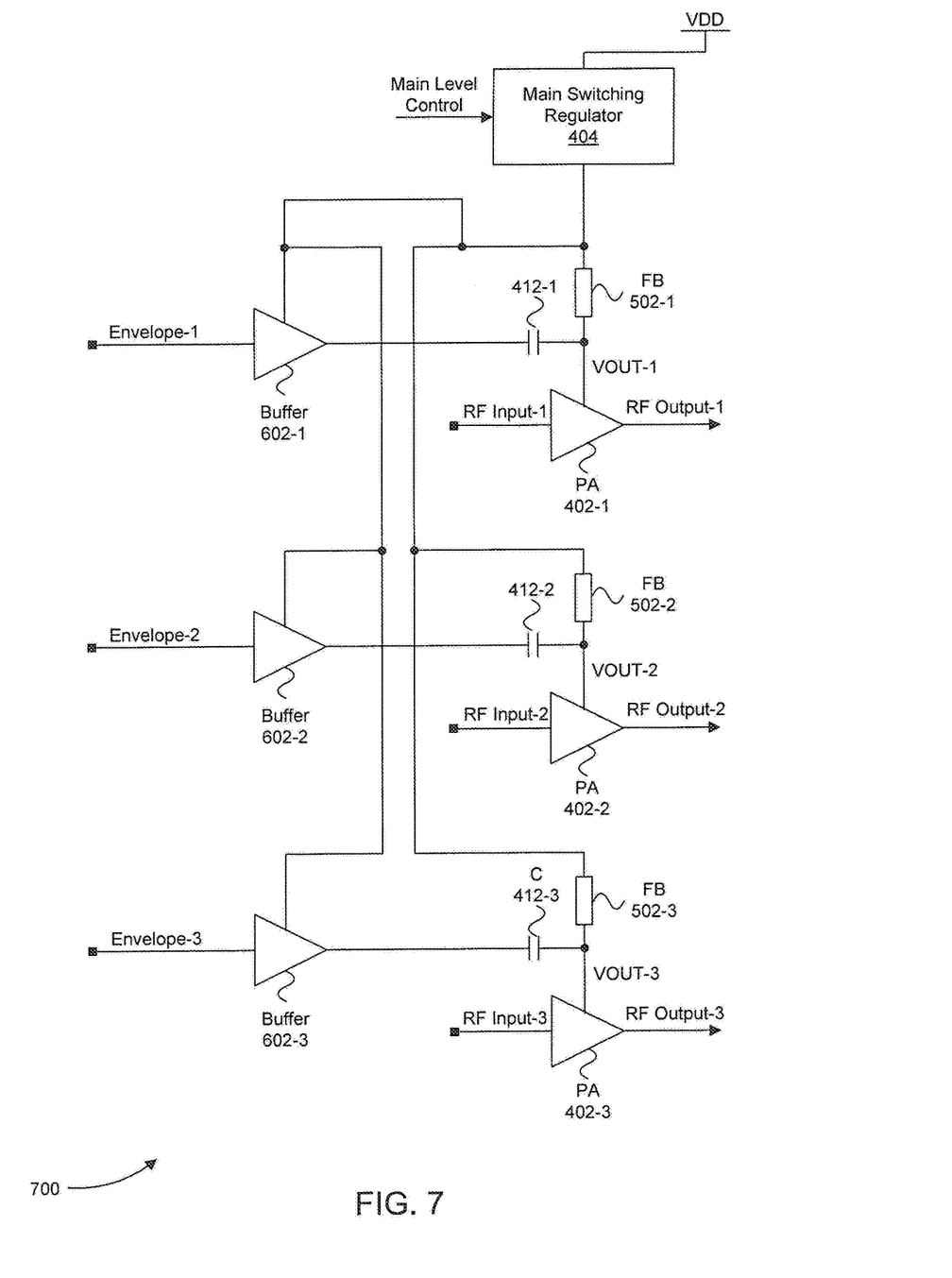
FIG. 7 illustrates a block diagram of an exemplary envelope tracking supply modulator for multiple PAs with component sharing in accordance with embodiments of the present disclosure.

Referring now to FIG. 7, an envelope tracking supply modulator 700 for multiple PAs is illustrated in accordance with embodiments of the present disclosure. Envelope tracking supply modulator 700 has the same configuration as envelope tracking supply modulator 500 in FIG. 5 with the exception that auxiliary switching regulator 408 and linear regulators 410-1, 410-2, and 410-3 have been replaced with buffers 602-1, 602-2, and 602-3. Buffers 602-1, 602-2, and 602-3 can be, for example, dynamic source followers, such as those commonly used as digital-to-analog converter (DAC) buffers. Buffer 602-1 is configured to provide the AC component for the supply voltage of PA 402-1 by modulating the output voltage of main switching regulator 404 based on envelope-1 of RF input-1. Buffer 602-2 is configured to provide the AC component for the supply voltage of PA 402-2 by modulating the output voltage of main switching regulator 404 based on envelope-2 of RF input-2. Buffer 602-3 is configured to provide the AC component for the supply voltage of PA 402-3 by modulating the output voltage of main switching regulator 404 based on envelope-3 of RF input-3.

It should be noted that envelope tracking supply modulators 400, 500, and 600 described above can be used in a wide number of applications and devices. For example, envelope tracking supply modulators 400, 500, and 600 can be used in wireless communication devices that implement two or more antennas. The PAs of envelope tracking supply modulators 400, 500, and 600 can be used to drive the antennas in such wireless communication devices. The wireless communication devices can be cellular communications devices (e.g., smartphones) or wireless local area network communication devices (e.g., IEEE 802.11 enabled devices). The multiple antennas in such wireless communication devices can be used to perform a multi-antenna technique as noted above, such as diversity, beamforming, or spatial multiplexing.

It should be noted that the use of the supply voltage name VDD above and in the figures is not intended to limit the structure or implementation of the devices that are connected/coupled to the supply voltage VDD. More specifically, although conventionally the supply voltage name VDD is connected/coupled to field-effect transistors, the structure or implementation of the devices that are connected/coupled to the supply voltage VDD are not so limited. These devices can use components other than (or in addition to) field-effect transistors, including bipoloar junction transistors.

5. CONCLUSION

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

What is claimed is:
1. An apparatus comprising:
   an auxiliary switching regulator configured to provide an auxiliary switching regulator output voltage;
   a main switching regulator configured to provide a DC supply component to both a first power amplifier and a second power amplifier;

a first linear regulator configured to generate a first AC supply component by modulating the auxiliary switching regulator output voltage based on an envelope of a first RF input to the first power amplifier and provide the first AC supply component to the first power amplifier; and a second linear regulator configured to generate a second AC supply component by modulating the auxiliary switching regulator output voltage based on an envelope of a second RF input to the second power amplifier and provide the second AC supply component to the second power amplifier.

2. The apparatus of claim 1, wherein the auxiliary switching regulator is configured to provide the auxiliary switching regulator output voltage from a supply voltage.

3. The apparatus of claim 2, wherein the auxiliary switching regulator output voltage is less than the supply voltage.

4. The apparatus of claim 2, wherein the main switching regulator is configured to provide the DC supply component from the supply voltage.

5. The apparatus of claim 1, wherein the main switching regulator is configured to provide the DC supply component to the first power amplifier through a first inductor and to the second power amplifier through a second inductor.

6. The apparatus of claim 1, wherein the main switching regulator is configured to provide the DC supply component to the first power amplifier through a first ferrite bead and to the second power amplifier through a second ferrite bead.

7. The apparatus of claim 1, wherein the main switching regulator is configured to provide the DC supply component from a supply voltage that is greater than the DC supply component.

8. An apparatus comprising:
a main switching regulator configured to provide a DC supply component to both a first power amplifier and a second power amplifier;
a first buffer configured to generate a first AC supply component based on an envelope of a first RF input to the first power amplifier and provide the first AC supply component to the first power amplifier; and
a second buffer configured to generate a second AC supply component based on an envelope of a second RF input to the second power amplifier and provide the second AC supply component to the second power amplifier.

9. The apparatus of claim 8, wherein the first buffer is a dynamic source follower.

10. The apparatus of claim 8, wherein the first buffer is powered by the DC supply component.

11. The apparatus of claim 8, wherein the main switching regulator is configured to provide the DC supply component to the first power amplifier through a first inductor and to the second power amplifier through a second inductor.

12. The apparatus of claim 8, wherein the main switching regulator is configured to provide the DC supply component to the first power amplifier through a first ferrite bead and to the second power amplifier through a second ferrite bead.

13. The apparatus of claim 8, wherein the main switching regulator is configured to provide the DC supply component from a supply voltage that is greater than the DC supply component.

14. A device comprising:
a first power amplifier for amplifying a first RF input to drive a first antenna;
a second power amplifier for amplifying a second RF input to drive a second antenna; and
an envelope tracking supply modulator comprising:
an auxiliary switching regulator configured to provide an auxiliary switching regulator output voltage;
a main switching regulator configured to provide a DC supply component to both the first power amplifier and the second power amplifier,
a first linear regulator configured to generate a first AC supply component by modulating the auxiliary switching regulator output voltage based on an envelope of the first RF input and provide the first AC supply component to the first power amplifier; and
a second linear regulator configured to generate a second AC supply component by modulating the auxiliary switching regulator output voltage based on an envelope of the second RF input and provide the second AC supply component to the second power amplifier.

15. The device of claim 14, wherein the auxiliary switching regulator is configured to provide the auxiliary switching regulator output voltage from a supply voltage.

16. The device of claim 15, wherein the auxiliary switching regulator output voltage is less than the supply voltage.

17. The device of claim 15, wherein the main switching regulator is configured to provide the DC supply component from the supply voltage.

18. The device of claim 14, wherein the main switching regulator is configured to provide the DC supply component to the first power amplifier through a first inductor and to the second power amplifier through a second inductor.

19. The device of claim 14, wherein the main switching regulator is configured to provide the DC supply component to the first power amplifier through a first ferrite bead and to the second power amplifier through a second ferrite bead.

20. The device of claim 14, wherein the main switching regulator is configured to provide the DC supply component from a supply voltage that is greater than the DC supply component.

* * * * *

UNITED STATES PATENT AND TRADEMARK OFFICE
CERTIFICATE OF CORRECTION

PATENT NO. : 9,614,477 B1  
APPLICATION NO. : 15/011186  
DATED : April 4, 2017  
INVENTOR(S) : Rozenblit et al.

Page 1 of 1

It is certified that error appears in the above-identified patent and that said Letters Patent is hereby corrected as shown below:

In Column 10, Line 20, In Claim 14 replace "amplifier," with --amplifier;--.

Signed and Sealed this  
First Day of May, 2018

Andrei Iancu  
*Director of the United States Patent and Trademark Office*